United States Patent
Misic et al.

(10) Patent No.: US 6,223,065 B1
(45) Date of Patent: Apr. 24, 2001

(54) AUTOMATIC COIL ELEMENT SELECTION IN LARGE MRI COIL ARRAYS

(75) Inventors: George J. Misic, Allison Park; J. Michael Watral, Freeport, both of PA (US)

(73) Assignee: Medrad, Inc., Indianola, PA (US)

( * ) Notice: Subject to any disclaimer, the term of this patent is extended or adjusted under 35 U.S.C. 154(b) by 0 days.

(21) Appl. No.: 09/104,656

(22) Filed: Jun. 25, 1998

Related U.S. Application Data

(60) Provisional application No. 60/081,959, filed on Apr. 15, 1998.

(51) Int. Cl.[7] .................................................. A61B 5/055
(52) U.S. Cl. ............................................ 600/410; 324/318
(58) Field of Search ................................ 600/410, 411, 600/415, 413, 421, 422; 324/318, 320; 128/899

(56) References Cited

U.S. PATENT DOCUMENTS

| | | |
|---|---|---|
| 4,793,356 | 12/1988 | Misic et al. . |
| 4,825,162 | 4/1989 | Roemer et al. . |
| 5,138,261 * | 8/1992 | Ratzel ..................................... 324/318 |
| 5,144,243 | 9/1992 | Nakabayashi et al. . |
| 5,160,891 * | 11/1992 | Keren ..................................... 324/318 |
| 5,197,474 * | 3/1993 | Englund et al. ................... 128/653.5 |
| 5,399,970 * | 3/1995 | Pelc et al. .............................. 324/309 |
| 5,430,378 * | 7/1995 | Jones ...................................... 324/318 |
| 5,488,950 * | 2/1996 | Ehnholm ............................ 128/653.1 |
| 5,551,430 | 9/1996 | Blakeley et al. . |
| 5,558,091 | 9/1996 | Acker et al. . |
| 5,680,861 * | 10/1997 | Rohling ............................... 128/653.1 |
| 5,706,813 * | 1/1998 | Filler et al. ........................ 128/653.5 |
| 5,729,129 | 3/1998 | Acker . |
| 5,759,152 * | 6/1998 | Felmlee et al. ....................... 600/410 |
| 5,823,960 * | 10/1998 | Young et al. .......................... 600/415 |
| 5,882,304 * | 3/1999 | Ehnholm et al. ..................... 600/411 |
| 5,910,728 * | 6/1999 | Sodickson ............................. 324/309 |
| 5,924,987 * | 7/1999 | Meany et al. .......................... 600/420 |
| 5,928,148 * | 7/1999 | Wang et al. ........................... 600/420 |
| 6,016,439 * | 1/2000 | Acker .................................... 600/411 |
| 6,084,411 * | 7/2000 | Giaquinto et al. .................... 324/318 |

OTHER PUBLICATIONS

International Search Report for counterpart PCT application No. PCT/US99/07851.

* cited by examiner

*Primary Examiner*—Marvin M. Lateef
*Assistant Examiner*—Shawna J Shaw

(57) ABSTRACT

A method of imaging a subject in an imaging system having a magnetic field and a plurality of receive coils movable with respect to the magnetic field includes sensing the magnetic field by means of at least one sensor having a known position with respect to the subject. At least one of the plurality of receive coils is selected in accordance with the sensing, and is enabled to form an image of the subject. The sensor may include a plurality of sensor coils disposed at differing locations within the magnetic field to sense the differing field amplitudes and/or phases thereof. The differing field intensities cause differing voltage amplitudes and/or phases to be induced on the sensor coils. The differing voltage amplitudes and/or phases are compared to determine the relative positions of the magnetic isocenter of the system and the receive coils to be enabled. Thus, a method for magnetic resonance imaging of a subject in an imaging system having a static magnetic field [B0], a selectively applied gradient magnetic field [B1], a selectively applied transmit excitation radio frequency magnetic field [RF B1], and a plurality of simultaneous data acquisition channels is taught wherein the location of a phased array or other multiple element receive coil and the subject patient with respect to the imaging center of the host magnetic resonance imaging system is determined by sensing the characteristics of one of the magnetic fields.

56 Claims, 4 Drawing Sheets

AUTOMATIC COIL ELEMENT SELECTION IN LARGE MRI COIL ARRAYS

CROSS-REFERENCE TO RELATED APPLICATION

This application claims the benefit of Provisional Application Ser. No. 60/081,959, filed on Apr. 15, 1998, the contents of which are hereby incorporated by reference.

BACKGROUND OF THE INVENTION

The present invention relates to magnetic resonance imaging ("MRI") and, more particularly, to a method and an apparatus for selectively enabling coils in an MRI host device.

Initially, MRI systems used whole body coils to image subjects, such as human patients. The whole body receive coils of these systems had the advantage that sensitivity was, to a first approximation, substantially constant over the entire region being imaged. While this uniformity in sensitivity was not strictly characteristic of such whole body receive coils, the sensitivity was substantially constant to a degree that most reconstruction techniques assumed a constant coil sensitivity. Due to their large volume, however, the whole body receive coils suffer from a relative insensitivity to, individual spins.

For certain applications, a surface coil is preferable to a whole body receive coil in MRI systems. For an example of a surface receiving coil, see U.S. Pat. No. 4,793,356 to Misic et al. Surface coils can be made much smaller in geometry than whole body receive coils, and for medical diagnostic use they can be applied near, on, or inside the body of a patient. This is especially important where attention is directed to imaging a small region within the patient, rather than an entire anatomical cross section. The use of a surface coil in MRI systems also reduces the noise contribution from electrical losses in the body in comparison to a corresponding whole body receive coil, while maximizing the desired signal. MRI systems thus typically use small surface coils for localized high resolution imaging.

A disadvantage of surface coils, however, is their limited field of view. A single surface coil can only effectively image a region of a subject having lateral dimensions comparable to the surface coil diameter. Therefore, surface coils necessarily restrict the field of view, and inevitably lead to a tradeoff between resolution and field of view. Generally, large surface coils generate more noise due to their exposure to greater patient sample losses and therefore have a larger noise component relative to the signal, while smaller coils have lower noise but in turn restrict the field of view to a smaller region.

One technique for extending the field-of-view limitation of a surface coil is described in U.S. Pat. No. 4,825,162, entitled "Nuclear Magnetic Resonance (NMR) Imaging with Multiple Surface Coils," issued to Roemer et al. Roemer et al. describes a set of surface coils arrayed with overlapping fields of view. Each of the surface coils is positioned to have substantially no interaction with any adjacent surface coils. A different response signal is received at each different surface coil from an associated portion of the sample that was enclosed within an imaging volume defined by the array. Each different response signal is used to construct a different one of a like plurality of different images of the sample. The different images are then combined to produce a single composite image of the sample. Roemer et al. describes a four coil array for imaging a human spine.

While an increased number of surface coils can be used in this manner to increase the field of view of MRI systems, MRI system scanners typically have a limited number of simultaneous data acquisition channels or receivers, and a limited number of selectable inputs. The number of selectable inputs is typically equal to the number of receivers. In some cases the number of selectable inputs is double the number of receivers, each receiver being capable of selectively receiving from either of two inputs. The number of data acquisition channels and separate inputs is therefore a design limitation on the number of phased array surface coils that can be used in an MRI system. A disadvantage of conventional phased array surface coils, therefore, is that the surface coil array can include only the number of surface coils that can be directly connected to the phased array inputs of the system scanner. The number of simultaneous data acquisition channels, or receivers, can be a further restriction on the utility of surface coil arrays.

To overcome the limitations of MRI system scanners imposed by the limited number of data acquisition channels or receivers, and the limited number of inputs, MRI technicians have resorted to physically moving the surface coils or manually switching selected groups of coils after successive scans to obtain MRI images. As can be appreciated, these techniques require excessive scan room intervention by personnel operating the MRI systems. That is, after each scan a technician must enter the scan room to physically reposition the coils, or manipulate a local selector switch to reconfigure the active coils of a large array to those needed to cover the desired patient anatomy. These scan room intervention techniques increase examination time and the likelihood of a patient rejecting the procedure.

SUMMARY OF THE INVENTION

The present invention provides automatic selection of phased array coil elements appropriate for an anatomical region being scanned, without scan room intervention by MRI personnel. In one aspect of the present invention, coil elements of the array may be automatically selected to image anatomical regions of a patient according to the locations of the coil elements relative to the isocenter of the MRI system. In another aspect, coil elements appropriate for an anatomical region to be scanned may be selected by moving the target anatomy of the patient to the magnetic isocenter of the MRI system.

According to a first preferred embodiment of the present invention, a method for magnetic resonance imaging of a subject in an imaging system having a magnetic field includes: providing a plurality of receive coils movable with respect to the magnetic field; providing a sensor having a known position with respect to the subject; and sensing the magnetic field with the sensor. At least one receive coil of the plurality of receive coils is selected in accordance with the sensing by the sensor. In response, the selected receive coil is enabled to form an image of the anatomical region of the subject.

In a preferred embodiment, the position of the phased array coil relative to (1) the isocenter of the system main magnet that creates the static [B0] magnetic field, and (2) the coils creating the transmit RF and/or gradient time varying [B1] magnetic fields is determined. A switch may be used to selectively enable the appropriate coil elements and to connect them to the phased array coil inputs of the host MRI system. The selected receive coil elements are used to form an image of the region of anatomy desired for a particular scan operation.

According to a second preferred embodiment of the present invention, a magnetic resonance system having a magnetic field includes a plurality of receive coils movable with respect to the magnetic field for imaging a subject, a sensor having a known position with respect to the subject for sensing the magnetic field, and a switching device for selecting one or more of the receive coils in accordance with the sensing of the magnetic field by the sensor.

According to another preferred embodiment of the present invention, a magnetic resonance system for determining the position of a subject within a magnetic field includes a sensor device having two or more spaced sensors movable with respect to the magnetic field. The sensors sense the amplitudes of the magnetic field at different locations within the magnetic resonance system and determine the position of the subject in accordance with the sensed amplitudes.

By providing automatic coil selection, the present invention eliminates the need for scan room intervention by MRI technicians to physically reposition the surface coils or to manually switch selected groups of coils after successive scans to image desired patient anatomical regions. Thus, the present invention can decrease both examination time and the likelihood of a patient rejecting the procedure.

The present invention, along with further aspects and attendant advantages, will best be understood by reference to the following detailed description taken in conjunction with the accompanying drawings.

DETAILED DESCRIPTION OF THE PRESENTLY PREFERRED EMBODIMENTS OF THE INVENTION

Figure 1:
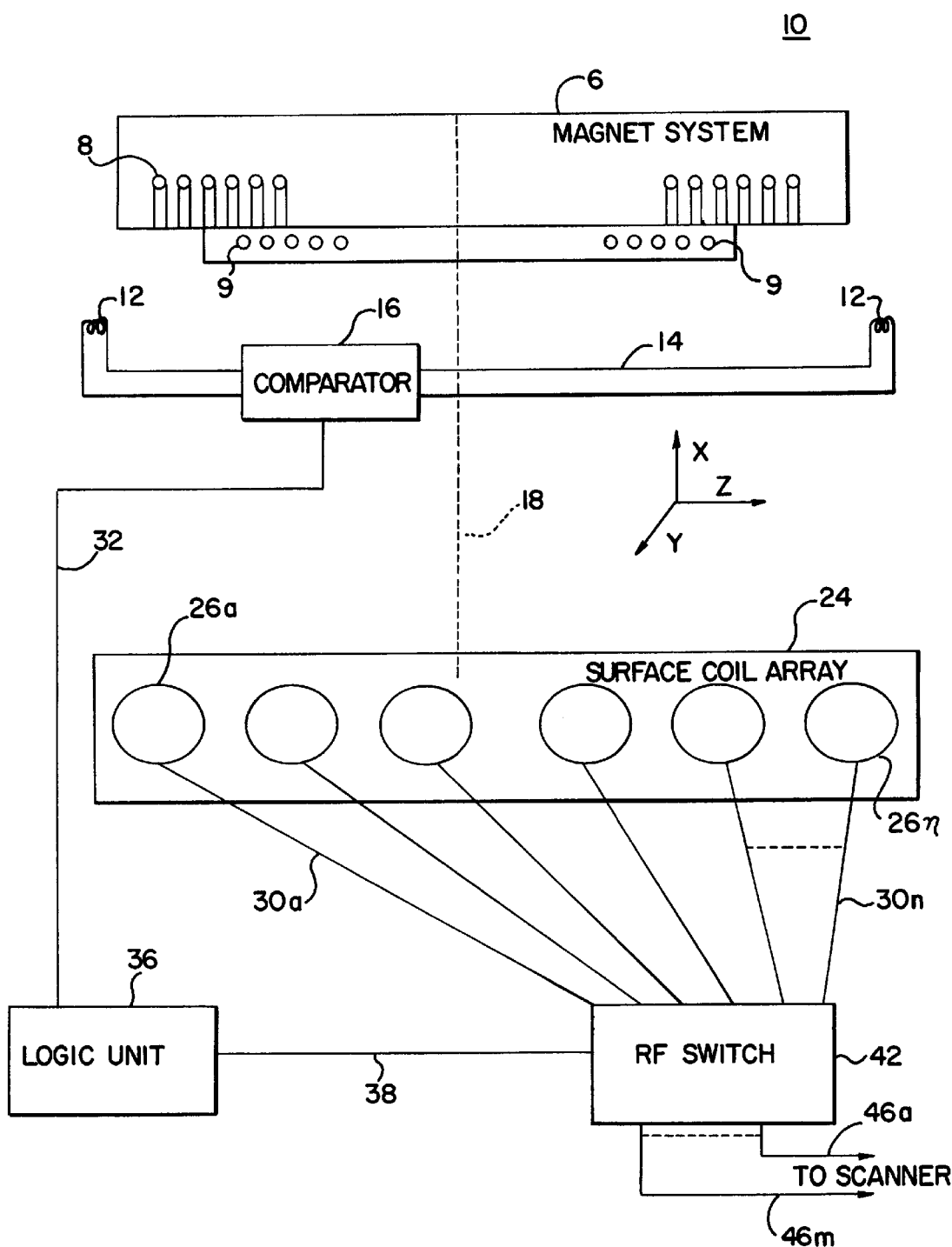
FIG. 1 shows a schematic representation of the magnetic resonance imaging system of the present invention.

Referring now to FIG. 1, there is shown a magnetic resonance imaging system 10 in accordance with a preferred embodiment of the present invention. Magnetic resonance imaging system 10 includes a magnet system 6 for providing a static magnetic field and applying the static magnetic field to an imaging subject, for example a human being, in order to form an image of the imaging subject. Magnet system 6 includes coils 8 for providing the static magnetic field, B0, of resonance imaging system 10, gradient field coils 9 for producing the audio frequency gradient field, B1, and a body coil for producing the radio frequency gradient field, RF B1.

Magnetic resonance imaging system 10 also includes surface coil array 24 for receiving the magnetic field energy produced by the subject patient in response to the imaging procedure within magnet system 6 and for providing electrical signals according to the received NMR signal to form the image of the subject. System magnetic isocenter 18 of the magnetic field provided by magnet system 6 passes through the horizontal center of magnet system 6. Isocenter 18 is horizontally translatable with respect to surface coil array 24 and the subject being imaged. Surface coil array 24 and the subject are also horizontally translatable with respect to the isocenter 18.

N surface coils 29a–n are included within surface coil array 24. The number N of surface coils 26a–n within surface coil array 24 can be any value, for example, N can be between two and twenty. Furthermore, surface coils 26a–n can be any type of receive coil. Each of the N surface coils 26a–n of surface coil array 24 is provided with a corresponding coil signal output line 30a–n. Each coil signal output line 30a–n can transmit an electrical signal representative of an image of a portion of the subject from its corresponding surface coil 26a–m during imaging of the subject.

According to the method of the preferred embodiment, surface coils 26a–n are selectively enabled within nuclear magnetic resonance imaging system 10 in order to scan selected regions of interest of the imaging subject with high resolution. In order to perform this method, M output signal lines 30a–n corresponding to selected surface coils 26a–n within surface coil array 24 are selectively coupled to M inputs 46a–m of imaging system 10, for forming different images, wherein N>M. While output signal lines 30a–n of the corresponding selected surface coils 26a–n are coupled to inputs 46a–m in this manner, the output signals of the remaining N–M unselected surface coils 26a–n are not coupled to any inputs and the N–M unselected surface coils 26a–n are thus electrically disabled. Inputs 46a–m can be preamplifier inputs to an MRI system scanner. (An apparatus and a method for coupling R coil elements of a phased array coil to S inputs of an MRI system scanner, where R>S, is disclosed in co-pending application Ser. No. 08/978,718, entitled "Peripheral Vascular Array," filed on Nov. 26, 1997, and assigned to the assignee of the present application, the contents of which are hereby incorporated by reference.)

The coupling of the M corresponding coil output signal lines 30a–n of the selected surface coils 26a–n to the M preamplifier inputs 46a–m can be performed by RF switch 42. Which M of the N surface coils 26a–n are coupled to preamplifier lines 46a–m by RF switch 42 is determined by control signals on switch control line 38 under the control of logic unit 36. The control signals applied to switch control line 38 by logic unit 36 are determined according to sensing signals applied to logic unit 36 by way of sense line 32.

The sensing signals of sense line 32 are representative of the position of the surface coil array 24 relative to the position of system magnetic isocenter 18. The relative position of magnetic isocenter 18 and coil array 24 can be determined by surface coil position sensor 14 in a number of ways. One preferred method of making this position determination is by sensing the gradient coil audio frequency magnetic pulses provided by gradient field coil 9. For example, the Z-axis gradient pulses can be sensed to make the position determination.

Figure 2A:
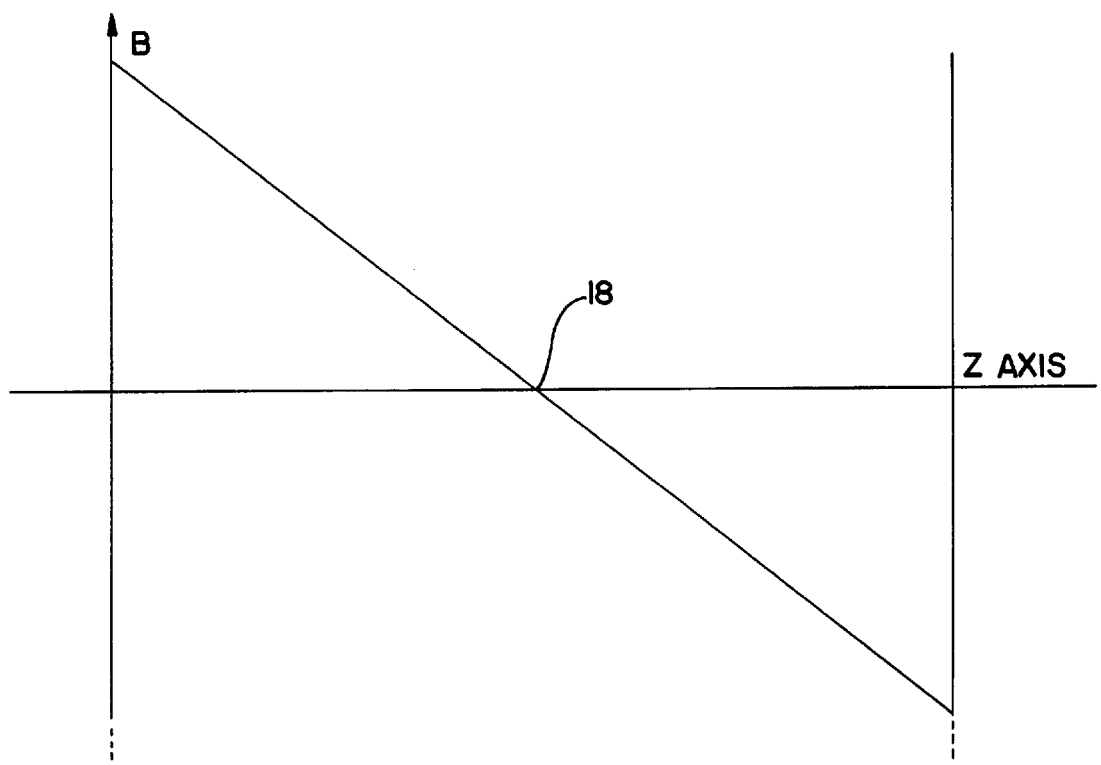
FIGS. 2A and 2B show graphical representations of magnetic fields provided within the magnetic resonance imaging system of FIG. 1.

In order to perform the sensing of the selectively applied magnetic fields of imaging system 10, shielded Z-axis gradient field sensors 12 can be disposed at each end of surface coil position sensor 14. Sensors 12 can be sensing coils. A voltage is induced in each gradient field sensing coil 12 by the audio frequency B1 field produced by gradient field coils 9 of magnet system 6. It will be understood that the gradient field sensed by sensing coils 12 is related to the distance along the Z-axis. In particular the amplitude of the gradient field B1 is zero at magnetic isocenter 18 and gets larger moving away from magnetic isocenter 18 as shown in FIG. 2A, The amplitude drops off rapidly past the ends of magnet system 6.

The amplitudes of the voltages induced on sensing coils 12 are applied to comparator 16. The amplitude of each induced voltage depends on the distance of the corresponding sensing coil 12 from system magnetic isocenter 18 since the amplitude of the induced voltage is determined by the magnitude of the gradient B1 field. The amplitudes of the induced voltages applied to comparator 16 by sense coils 12 can be compared by comparator 16 and the relative amplitudes used to provide spatial information. Optionally, phase can be used to determine the relative positions of magnetic isocenter 18. The determinations can be made for example, by table lookups, mathematical calculations or any kind of comparison device. It is well known by those skilled in the art how to use such tables and calculations to determine the relative positions of surface coil array 24 and magnetic isocenter 18 in this manner. It will be understood that any known sensing device capable of providing an indication of the magnitude of the static [B0] magnetic field, the audio frequency gradient, the transmit RF magnetic field or the gradient time varying [B1] magnetic field can perform the functions of sensing devices 12.

Figure 2B:
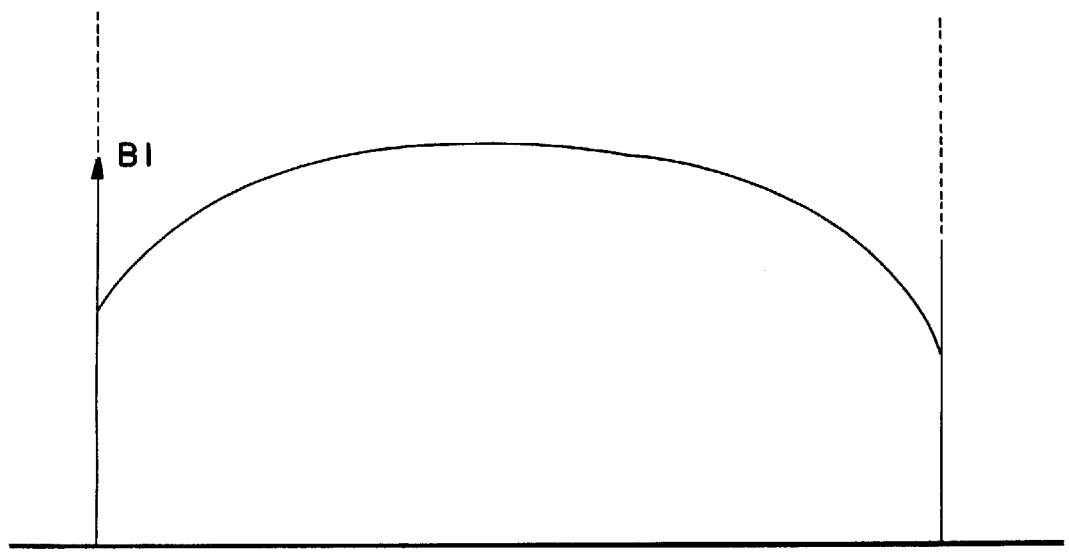

In an alternate preferred embodiment, the relative positions of system magnetic isocenter 18 and surface coil array 24 can be determined using the transmit RF B1 field pulses generated by the system body coil. In practicing this alternate embodiment, it will be understood that there is a spatial dependency of the magnitude of the RF transmit B1 field along the Z-axis of system 10 which runs from the head to the foot of the imaging subject. This field is typically maximum at magnetic isocenter 18 and drops off rapidly beyond the ends of the system transmit body coil, as shown in FIG. 2B. It will also be understood that sensing devices 12 and comparator 16 can provide signals to logic unit 36 in order to control RF switch 42 according to the B0 field in the manner previously described with respect to the B1 field.

In a variation of the above alternate embodiments, more than two field sensing coils 12 can be provided for measuring the magnetic fields of magnet system 6 and determining the relative positions within magnetic resonance imaging system 10. The use of additional sensing coils 12 helps to determine the isocenter and field drop off points beyond the ends of imaging system 10, and thus the relative positions of surface coil array 24 and the body coil.

Logic unit 36 applies control signals to switch control line 38 according to sensing signals from sensing coils 12 of position sensor 14 by way of sense line 32, as previously described. In performing these operations, logic unit 36 can determine which M surface coils 26a–n within surface coil array 24 are required for a desired scanning range during imaging of the subject. RF switch 42, which performs the coupling of surface coils 26a–n to input lines 46a–m and the decoupling of surface coils 26a–n from input lines 46a–m under the control of logic unit 36, can include a PIN diode type switch or any other type of switching device capable of performing the required operations. For example, in the case wherein N=8, RF switch 42 can include four PIN diode switches, each PIN diode switch being capable of connecting either of two surface coils 26a–n to a single input line 46a–m.

Surface coils 26a–n are typically disabled in two ways when they are not selected within magnetic resonance imaging system 10. They can be disconnected from phased array coil input lines 46a–m using series PIN diodes within RF switch 42. Additionally, the transmit PIN diode can be biased on at all times. Thus inactive surface coils 26a–n can be held in an inactive state by switching the inputs into a decoupled state using the same means used for transmit decoupling of the surface coil 26a–n.

Figure 3:
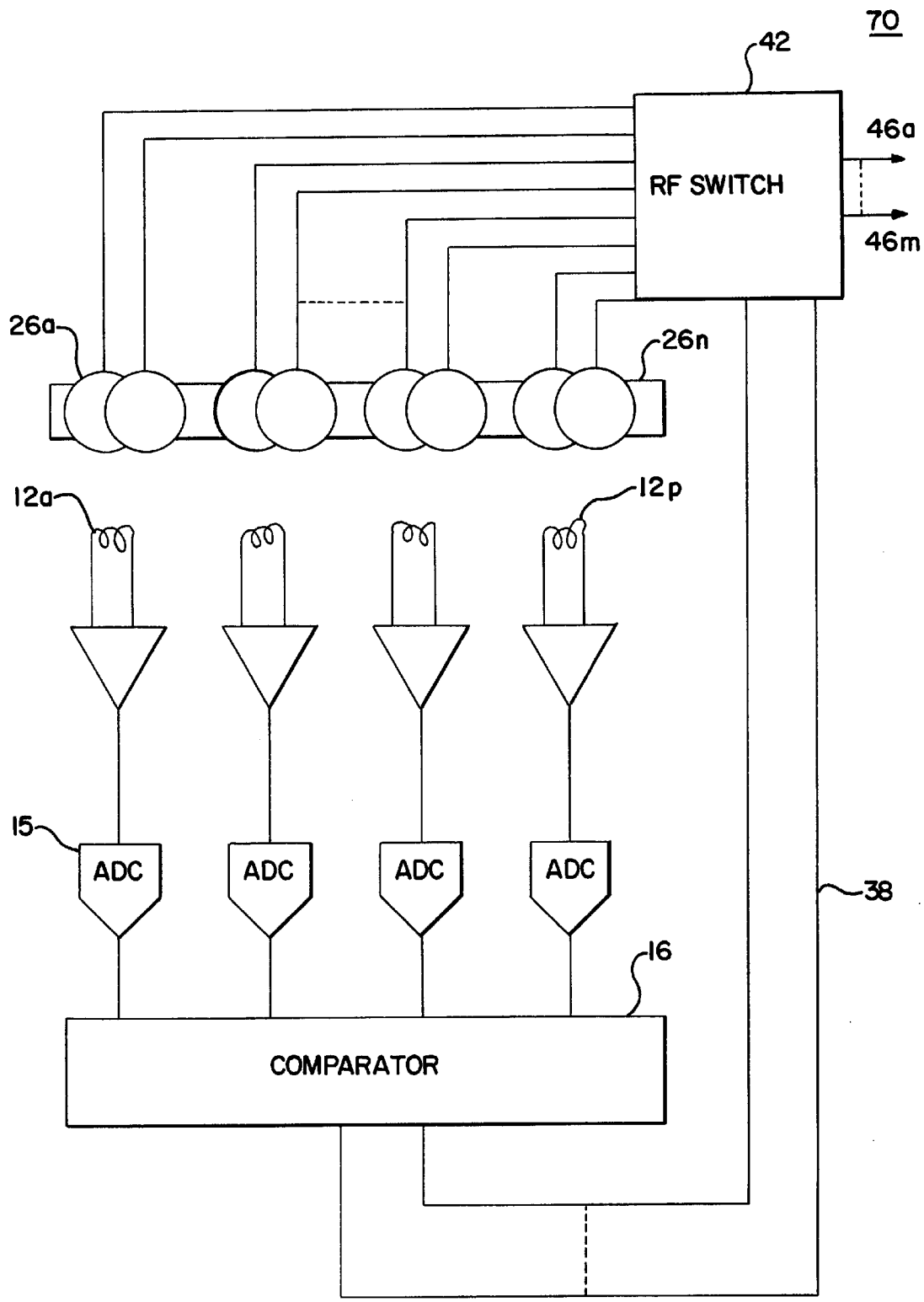
FIG. 3 shows a schematic representation of a further alternate embodiment of the magnetic resonance imaging system of FIG. 1.

Referring now to FIG. 3, there is shown magnetic resonance imaging system 70 of the present invention. Magnetic resonance imaging system 70 is an alternate embodiment of nuclear magnetic resonance imaging system 10. In imaging system 70, each pair of surface coils 26a–n is provided with a separate sensing coil 12a–p. The outputs of gradient B1 field sensing coils 12a–p are applied to comparator 16 by way of converters 15. During imaging of a subject using imaging system 70, comparator 16 compares the outputs of sensing coils 12a–p and determines which output has the smallest amplitude, corresponding to the location closest to the system isocenter. Alternately, RF B1 sensing coils and the largest amplitude, corresponding to the same location, can be used. The surface coils 26a–n corresponding to the sensing coils 12a–p having the smallest output amplitude are selected and enabled by RF switch 42 according to control signals on switch control line 38, as previously described.

Figure 4:
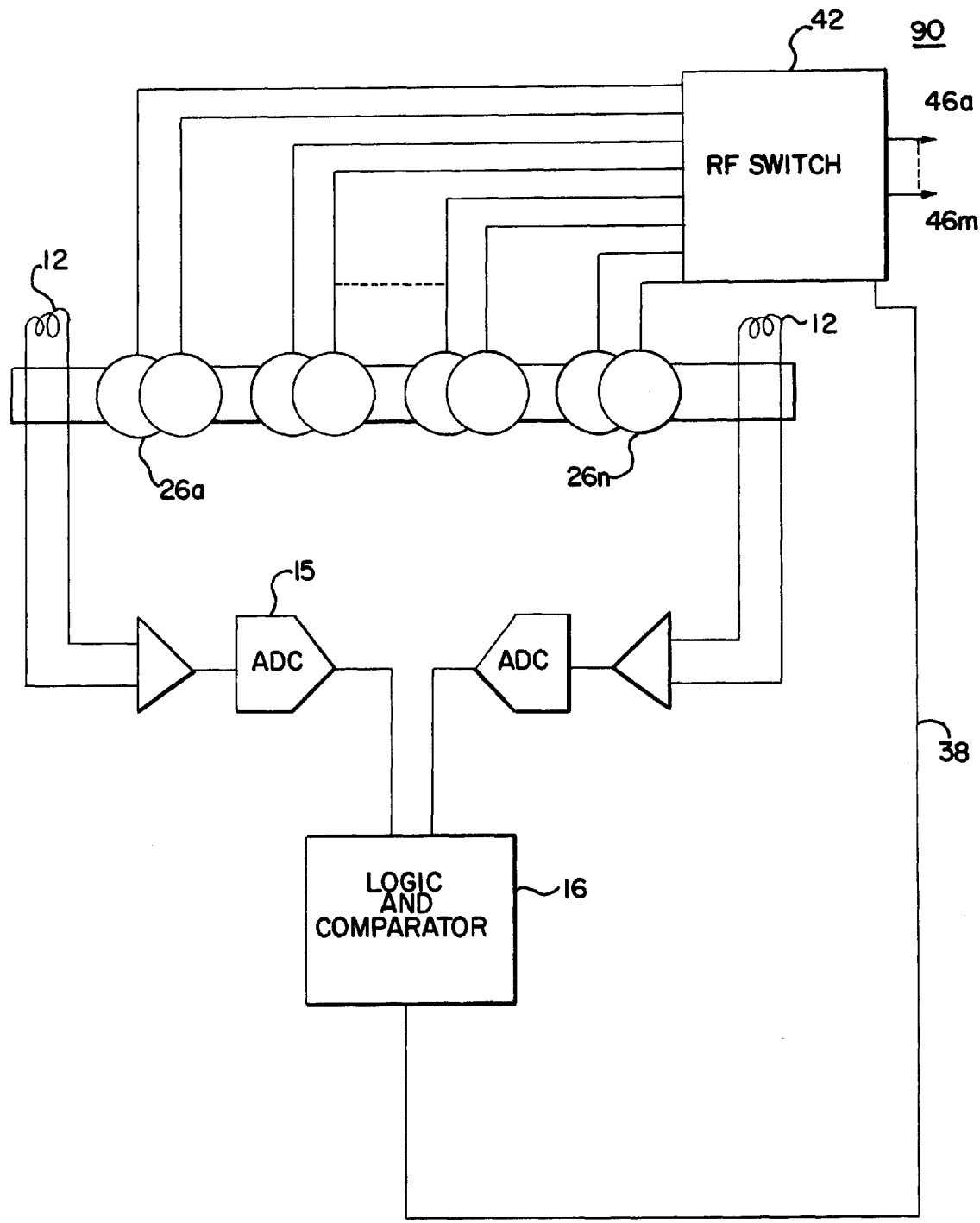
FIG. 4 shows a schematic representation of a further embodiment of the magnetic resonance imaging system of FIG. 1.

Referring now to FIG. 4, there is shown magnetic resonance system 90 of the present invention. Magnetic resonance system 90 is an alternate embodiment of nuclear resonance system 10. In imaging system 90, field energy received by surface coils 26a–n is sensed by sensing coils 12. The outputs of sensing coils 12 are applied to comparator 16 by way of converters 15. Thus, as previously described, the correct sensing coils 26a–n can be selected using switch 42.

The present invention advantageously provides automatic selection of phased array coil elements appropriate for an anatomical region being scanned, without scan room intervention. Coil elements of the array may be automatically selected to image anatomical regions of a patient according to the locations of the coil elements relative to the isocenter of the MRI system. Further, coil elements appropriate for an anatomical region to be scanned may be selected by moving the target anatomy of the patient to the magnetic isocenter of the MRI system.

By providing automatic coil selection, the present invention eliminates the need for scan room intervention to physically reposition the surface coils or to manually switch selected groups of coils after successive scans to image the desired anatomical regions of patients. Accordingly, the present invention can decrease both examination time and the likelihood of a patient rejecting the procedure.

It should be appreciated that changes and modifications may be made to the above-described embodiments of the present invention. Therefore, the embodiments described above are to be considered in all respects as being illustrative of the present invention, and not restrictive. The scope of the invention is indicated by the following claims rather than by the foregoing description. All changes which fall within the meaning and range of equivalency of the claims are to embraced within their scope.

What is claimed is:

1. A method of imaging a subject, comprising the steps of:
providing a magnetic resonance imaging system having a magnetic field;
providing a plurality of receive coils movable with respect to the magnetic field;
providing at least one sensor having a known position with respect to the plurality of coils;
sensing the magnetic field with the at least one sensor;
selecting at least one receive coil of the plurality of receive coils in accordance with the sensing of the magnetic field; and
enabling the selected at least one receive coil to form an image of a region of the subject.

2. The method of claim 1 wherein the step of selecting comprises selecting a plurality of receive coils in accordance with the sensing.

3. The method of claim 2, further comprising the step of determining a number of the plurality of receive coils to be selected in accordance with the sensing.

4. The method of claim 2 wherein the imaging system comprises externally provided selection information, and further comprising the step of determining a number of the plurality of receive coils to be selected in accordance with the externally provided selection information.

5. The method of claim 1, further comprising the step of electrically coupling the selected at least one receive coil to a scanner having at least one scanner input.

6. A magnetic resonance imaging system for imaging a subject, the imaging system comprising:
   a plurality of receive coils movable with respect to a magnetic field for imaging anatomical regions of the plurality of coils;
   at least one sensor having a known position with respect to the subject for sensing the magnetic field; and
   a switching device for selecting at least one of the plurality of receive coils in accordance with the sensing of the magnetic field by the at least one sensor.

7. The magnetic resonance imaging system of claim 6, further comprising an imaging device for forming an image of the subject in response to selecting at least one of the plurality of receive coils.

8. A method of imaging a subject, comprising the steps of:
   setting an imaging subject in close proximity to a plurality of receive coil elements;
   applying a magnetic field to the imaging subject, the receive coil elements and the subject being movable relative to the magnetic field;
   sensing the magnetic field with at least one sensor having a known position with respect to the plurality of receive coil elements;
   selecting at least one receive coil element element from the plurality of receive coil elements in accordance with the sensing of the magnetic field; and
   enabling the selected at least one receive coil elements to form an image of a region of the subject in response to being selected.

9. The method of claim 8 wherein the magnetic field has an axis running longitudinally from one end of the subject to an opposite end of the subject, and wherein the step of sensing the magnetic field with at least one sensor further comprises the step of disposing a plurality of sensors along the axis.

10. The method of claim 8 wherein the magnetic field comprises differing field amplitudes at differing locations, and wherein the steps of sensing the magnetic field with at least one sensor further comprises the steps of:
   disposing a plurality of sensors at select positions corresponding to the differing field amplitudes; and
   sensing the differing field amplitudes.

11. The method of claim 10 wherein the step of selecting comprises selecting at least one receive coil according to a comparison of the sensed differing field amplitudes.

12. The method of claim 11 wherein the magnetic field defines an imaging volume having an isocenter, the differing field amplitudes being distributed about the isocenter, wherein:
   the step of selecting comprises the step of selecting a plurality of receive coil elements that are centered about the isocenter.

13. The method of claim 12, further comprising the step of determining a number of the plurality of receive coil elements to be selected in accordance with the sensing.

14. The method of claim 12 wherein the imaging system comprises externally provided selection information, and further comprising the step of determining a number of the plurality of receive coil elements to be selected in accordance with the externally provided selection information.

15. The method of claim 11 wherein the magnetic field has differing phases at differing locations and the plurality of sensors and further comprising the step of disposing the plurality of sensors at differing locations to sense the differing phases.

16. The method of claim 8 wherein the step of selecting comprises selecting a plurality of receive coil elements in accordance with the sensing.

17. The method of claim 8, further comprising the step of electrically coupling the selected at least one receive coil to a scanner having at least one scanner input.

18. The method of claim 17 wherein the step of electrically coupling the selected at least one receive coil comprises the step of coupling at least one of N receive coil elements, to at least one of M scanner inputs, and N>M.

19. The method of claim 17 herein the step of selecting further comprises the step of selecting a number of receive coil elements that is less than or equal to M.

20. The method of claim 8 wherein the step of applying the magnetic field includes the step of applying a gradient B1 field, and wherein the step of sensing comprises the step of sensing the gradient B1 field.

21. The method of claim 8 wherein the step of applying the magnetic field includes the step of applying an RF B1 field, and wherein the step of sensing comprises the step of sensing the RF B1 field.

22. The method of claim 8 wherein the step of applying the magnetic field includes the step of applying a static magnetic B0 field, and wherein the step of sensing comprises the step of sensing the static magnetic B0 field.

23. The method of claim 8 further comprising the step of arranging the plurality of receive coil elements in pairs of receive coil elements and providing the pairs of receive coil elements with corresponding sensors.

24. The method of claim 8 further comprising the step of arranging the plurality of receive coil elements in pairs of coil elements comprising quadrature coils.

25. The method of claim 8 wherein the step of sensing comprises the step of sensing a selectively applied gradient B1 magnetic field with at least one sensor.

26. The method of claim 8 wherein the step of sensing comprises the step of sensing a transmit B1 magnetic field with at least one sensor.

27. A magnetic resonance imaging system comprising:
   a plurality of receive coil elements movable with respect to a magnetic field, the magnetic field operable to generate magnetic energy in a subject, the plurality of receive coil elements operable to receive the magnetic energy when the subject is set in proximity to the plurality of receive coil elements;
   at least one sensor having a known position relative to the plurality of receive coil elements, the sensor operable to sense the magnetic field; and
   a switching device coupled to the at least one sensor, the switching device operable to select at least one of the plurality of receive coil elements in accordance with the sensing of the magnetic field by the at least one sensor.

28. A magnetic resonance imaging system as claimed in claim 27 further comprising an imaging device coupled to the plurality of receive coil elements to form an image of the subject in response to selecting at least one of the plurality of receive coil elements.

29. A magnetic resonance imaging system as claimed in claim 27 the at least one sensor generates at least one sensing signal indicative of a position of the receive coil elements relative to the magnetic field.

30. A magnetic resonance imaging system as claimed in claim 27 wherein the at least one sensor comprises a plurality of sensors.

31. A magnetic resonance imaging system as claimed in claim 30 wherein the magnetic field has an axis running longitudinally from one end of the subject to an opposite end of the subject, and wherein the plurality of sensors are disposed along the axis.

32. A magnetic resonance imaging system as claimed in claim 30 wherein the magnetic field has differing field amplitudes at differing locations, and wherein the plurality of sensors are disposed at differing location to sense the differing field amplitudes.

33. A magnetic resonance imaging system as claimed in claim 27 wherein the selected at least one of the plurality of receive coil elements is coupled to a scanner having at least one scanner input.

34. A magnetic resonance imaging system as claimed in claim 33 wherein the at least one receive coil comprises N coil elements, the at least one scanner input comprises M scanner inputs, and N>M.

35. A magnetic resonance imaging system as claimed in claim 27 wherein the magnetic field includes a gradient B1 field, the at least one sensor being operable to sense the gradient B1 field.

36. A magnetic resonance imaging system as claimed in claim 27 wherein the magnetic field includes a RF B1 field, the at least one sensor being operable to sense the RF B1 field.

37. A magnetic resonance imaging system as claimed in claim 27 wherein the magnetic field includes a static magnet B0 field, the at least one sensor being operable to sense the static magnet B0 field.

38. A magnetic resonance imaging system as claimed in claim 27 wherein the plurality of receive coil elements are arranged in pairs of receive coil elements, and wherein the at least one sensor includes at least one sensor corresponding to each of the pairs of receive coil elements.

39. A magnetic resonance imaging system as claimed in claim 27 wherein the plurality of receive coil elements are arranged in quadrature coil pairs.

40. A magnetic resonance imaging system as claimed in claim 39 wherein the at least one sensor includes at least one sensor corresponding to each of the quadrature coil pairs.

41. A magnetic resonance imaging system as claimed in claim 27 wherein the at least one sensor is responsive to a selectively applied gradient B1 magnetic field.

42. A magnetic resonance imaging system as claimed in claim 27 wherein the at least one sensor is responsive to a transmit B1 magnetic field.

43. A magnetic resonance imaging system as claimed in claim 27 wherein the magnetic field has differing phases at differing locations and the plurality of sensors are disposed at differing locations to sense the differing phases.

44. A magnetic resonance imaging system comprising:
  a plurality of receive coil elements movable with respect to a magnetic field, the magnetic field operable to generate magnetic energy in a subject, the plurality of receive coil elements operable to receive the magnetic energy when the subject is set in proximity to the plurality of receive coil elements;
  a sensor device for determining the position of the subject within the magnetic field, the sensor device comprising at least two sensors movable within the magnetic field for sensing the amplitudes of the magnetic field at differing locations therein and for determining the position of the subject within the magnetic field in accordance with the amplitudes sensed by the at least two sensors;
  a sensing signal generated by the sensor device, the sensing signal indicative of the position of the subject withing the magnetic field; and
  a switching device coupled to the sensor device, the switching device operable to select at least one of the plurality of receive coil elements in accordance with the sensing signal.

45. A magnetic resonance imaging system as claimed in claim 44 wherein the selected at least one of the plurality of receive coil elements is coupled to a scanner having at least one scanner input.

46. A magnetic resonance imaging system as claimed in claim 44 wherein the at least one receive coil comprises N coil elements, the at least one scanner input comprises M scanner inputs, and N>M.

47. A magnetic resonance imaging system as claimed in claim 44 wherein the magnetic field includes a gradient B1 field, the at least two sensors being operable to sense the gradient B1 field.

48. A magnetic resonance imaging system as claimed in claim 44 wherein the magnetic field includes a RF B1 field, the at least two sensors being operable to sense the RF B1 field.

49. A magnetic resonance imaging system as claimed in claim 44 wherein the magnetic field includes a static magnet B0 field, the at least two sensors being operable to sense the static magnet B0 field.

50. A magnetic resonance imaging system as claimed in claim 44 wherein the plurality of receive coil elements are arranged in pairs of receive coil elements, and wherein the at least two sensors includes at least one sensor corresponding to each of the pairs of receive coil elements.

51. A magnetic resonance imaging system as claimed in claim 44 wherein the plurality of receive coil elements are arranged in quadrature coil pairs.

52. A magnetic resonance imaging system as claimed in claim 51 wherein the at least one sensor includes at least one sensor corresponding to each of the quadrature coil pairs.

53. A magnetic resonance imaging system as claimed in claim 44 wherein the at least two sensors are responsive to a selectively applied gradient B1 magnetic field.

54. A magnetic resonance imaging system as claimed in claim 44 wherein the at least two sensors are responsive to a transmit B1 magnetic field.

55. A magnetic resonance imaging system as claimed in claim 44 wherein the magnetic field has differing phases at differing locations and the at least two sensors are disposed at differing locations to sense the differing phases.

56. A method of imaging a subject, comprising the steps of:
  setting an imaging subject in close proximity to N receive coil elements, where N>1;
  applying a magnetic field to the imaging subject, the receive coil elements and the subject being movable relative to the magnetic field;
  sensing the magnetic field with at least one sensor having a known position with respect to the N receive coil elements;
  selecting fewer than N of the receive coil elements in accordance with the sensing of the magnetic field; and
  enabling the selected fewer than N receive coil elements to form an image of a region of the subject in response to being selected;
  wherein the selected fewer than N receive coil elements represent an optimum combination of coil elements selected to produce a best image.

* * * * *